United States Patent [19]

Clanton

[11] Patent Number: 4,929,284
[45] Date of Patent: May 29, 1990

[54] WATER REMOVABLE SOLDER STOP

[75] Inventor: James A. Clanton, Wenonah, N.J.

[73] Assignee: General Electric Company, Camden, N.J.

[21] Appl. No.: 285,697

[22] Filed: Dec. 16, 1988

[51] Int. Cl.$^5$ .............................................. B23K 35/34
[52] U.S. Cl. ......................................... 148/23; 148/26
[58] Field of Search .............................. 148/23, 24, 26

[56] References Cited

U.S. PATENT DOCUMENTS

| | | | |
|---|---|---|---|
| 3,149,007 | 9/1964 | Chamer | 148/26 |
| 3,309,239 | 3/1967 | Harris | 148/24 |
| 3,599,326 | 8/1971 | DiRenzo | 29/626 |
| 3,703,386 | 11/1972 | Dietz | 106/39 |
| 3,906,617 | 9/1975 | Behringer et al. | 228/118 |
| 3,981,753 | 9/1976 | Hopper | 148/23 |
| 4,113,524 | 9/1978 | Katz | 148/23 |
| 4,120,843 | 10/1978 | Ameen et al. | 260/33.8 R |
| 4,439,250 | 3/1984 | Acharya et al. | 148/23 |

Primary Examiner—Peter D. Rosenberg
Attorney, Agent, or Firm—Raymond E. Smiley

[57] ABSTRACT

A solder stop composition and a method of preventing a melt condition in a meltable metal alloy on a substrate, such as a circuit board, wherein the composition applied on the alloy contains a water soluble binder, a viscosity control agent, a thermal insulator filler, a water soluble moisturizer extender control agent and water. The dried composition is non-tacky and can be removed from the substrate with water. A typical composition capable of being cured to a dry state on a substrate contains water, glycerin, amorphous silica, glass microballoons filled with inert gas and ethylene glycol.

16 Claims, No Drawings

WATER REMOVABLE SOLDER STOP

BACKGROUND OF THE INVENTION

The present invention relates to a method and composition for protecting a meltable substance on a substrate, and more particularly, to an improved removable solder stop composition and method for protecting solder on a printed circuit or other substrate during the application of heat, such as during a solder dipping procedure.

In the manufacture of various modules, such as printed wiring boards and similar devices, it is frequently necessary to protect a meltable substance, such as solder deposited on a substrate, from heat to prevent remelting of the substance. For example, printed wiring boards utilize utectic tin-lead alloy solder plating which is reflowed to insure post solderability. The reflowed surface is flat and smooth. Frequently, this flatness must be retained on the bottom side of the printed wiring board for grounding/EMI purposes which mate to a flat housing. If this surface is not protected from the heat of molten solder in a solder pot, it will remelt and form uneven surfaces upon contact and exposure to the molten (260° C.) solder in the solder pot. The lumpy and irregular surfaces interfere with the grounding contact to the castings for EMI/RFI shielding. To prevent remelting and the formation of lumpy and/or irregular surfaces on the solder, the solder alloy must be protected in selected areas from the heat (260° C.) of the hot solder in the solder pot during the in-line soldering of the components placed in the printed wiring boards. The surface of the printed wiring board comes into intimate contact with the hot solder for several seconds during the regular soldering operation.

Generally, the in-line soldering of the components is achieved on an in-line soldering machine where the solder stop is applied first, then exposed to pre-heating, followed by soldering with hot molten solder from a solder pot and in-line cleaning of the total assembly. During the cleaning operation, the solder stop must be completely removed.

Solder stops are applied in various ways, however, commonly, solder stops are screened by silk screening techniques over the surfaces of the solder in the areas where it is desired to protect the solder plate from remelting or picking up additional solder from the molten solder in the pot.

Several of the well-known solder stops must be removed by organic solvents which present environmental and health hazards. Water-soluble solder stops are also known in the prior art, however, they are generally inadequate and/or uneconomical when used in protecting the meltable substance, such as solder, on a substrate.

It is generally desirable that solder stops be water-soluble, or at least, removable from the substrate to which they are applied, by water. It is also preferred that the water soluble solder stop be curable to a dry condition in order to permit handling and shipping as well as in-line machine use. The preferred solder stops must adhere to the surface to which they are applied and must be non-tacky to touch with no cracking or flaking from the substrate. Furthermore, the solder stops must not be affected by the application of flux prior to soldering. Although many types of application systems and methods may be used to apply solder stops to the substrates being protected, it is generally preferred that the solder stop compositions be applied by conventional silk screening techniques and/or stencilling techniques and/or other high speed methods. The cured and/or dried coating must be a good thermal barrier to protect the meltable substrate while the substrate is being subjected to temperatures up to about 260° C. or higher, for example, in a molten solder pot. Finally, the solder stops are removable by water, for example, by in-line water cleaners. The ingredients of the solder stop must not contaminate or leave residues on the printed wiring board or other substrate. The prior art solder stops are incapable of achieving all of the foregoing desirable characteristics.

One of the prior art solder stops contains glycerin and amorphous silica. This prior art composition is water soluble and can be removed by in-line water cleaners. However, the glycerin/amorphous silica composition does not provide a good thermal barrier to protect meltable solder plated circuits while in contact with molten solder at temperature up to 260° C. (500° F.) in a solder pot. Furthermore, the glycerine/amorphous silica solder stop and other prior art products are either tacky, especially when the humidity is high, or they crack and shrink during cold weather and are not sufficiently insulating to prevent the solder surfaces covered therewith from reflowing. The only satisfactory prior art technique is the adhesive masking tape technique which is very costly to apply because it must be done manually and selectively. Furthermore, the adhesive masking tapes frequently bubble and lift from the substrate as a result of the heat from the molten solder in the solder pot. Furthermore, masking tapes must be removed manually from the substrate being protected.

SUMMARY OF THE INVENTION

Accordingly, it is the primary object of the present invention to provide improved solder stop compositions.

It is another object of the present invention to provide an improved solder stop composition which cures or dries readily to a non-tacky state without shrinking, cracking or flaking from the substrate.

It is another object of the present invention to provide a solder stop composition which is a thermal barrier to the substrate to which it is applied and which prevents solder or other remeltable substances from remelting when the substrate is subjected to a source of heat, such as the heat from molten solder in a solder pot.

It is another object of the present invention to provide a solder stop composition which, when dried, is easily handled; which can be removed by water washing; and which does not leave residues on the substrate after it is removed by water.

It is another object of the present invention to provide a method of protecting a meltable substance on a substrate by applying an improved solder stop composition by silk screening and/or stencilling and/or other high speed method for applying the composition to the substrate.

These and other objects are achieved by a composition capable of being cured to a dried state on a substrate and removable from the substrate by water, comprising, a water-soluble binder, a viscosity control agent, a thermal insulator filler and a water-soluble moisturizer extender control agent.

In accordance with the present invention, there is also provided a method of preventing a melt condition in a meltable substance on a substrate by applying a composition containing water, a water-soluble binder, a viscosity control agent, a thermal insulator filler and a water-soluble moisturizer extender control agent on a surface to be exposed to heat, the composition being removable in its entirety by water washing, and curing or drying the composition on the substrate to a dried state. Therefore, heat is applied to at least a portion of the substrate containing the meltable substance whereby the meltable substance retains its solid integrity during the application of heat, and the dried composition is subsequently removed from the surface by water washing.

It has been found that the compositions of this invention are curable to a dry condition which permits handling and shipping as well as in-line machine use wherein the composition adheres to the surface of the substrate to which it is applied and remains non-tacky to touch even under humid conditions with no cracking, shrinking or flaking. Furthermore, the compositions of the present invention are not affected by the application of flux prior to soldering, and they can be easily applied to the substrates by screening and/or stencilling and/or other high speed methods. The cured or dried composition is an excellent thermal barrier and even protects such meltable substances as solder alloys plated on circuit boards while the circuit board is in contact with hot molten solder at temperatures up to 260° C. (500° F.) or higher in a solder pot for about 4 to about 10 seconds. Furthermore, the compositions of the present invention do not contaminate the printed circuit boards, and they do not leave residues thereon after water washing.

DETAILED DESCRIPTION OF THE INVENTION

The dried solder stop compositions of the present invention, contain four basic ingredients including a water-soluble binder; a viscosity control agent in an amount sufficient to increase the consistency of the composition to a semisolid paste; a thermal insulator filler in an amount which prevents heat from passing through the composition in a dried, solid state on a substrate; and a water-soluble moisturizer extender control agent in an amount sufficient to prevent cracking and tackiness of the solder stop composition in the dried, solid state on a substrate. The solder stop compositions capable of being cured to a dried state on a substrate and removable from the substrate by water in accordance with the present invention include the four basic ingredients listed above and water prior to drying or curing. After drying or curing the composition contains only the four essential ingredients and residual water.

In one of the preferred embodiments of the present invention, the total solder stop composition contains about 25% to about 35% by weight of the water soluble binder in water; about 1% to about 6% by weight of the viscosity control agent; about 10% to about 20% by weight of the thermal insulator filler; about 4% to about 12% by weight of a water soluble moisturizer extender control agent and the balance or remainder, water. In this preferred embodiment the water comprises about 45% to about 55% by weight of the composition. Unless otherwise stated, all percentages by weight are percentages by weight of the total composition, and the total weight of the water, binder, viscosity control agent, thermal insulator filler and moisturizer extender control agent is 100% unless other conventional fillers, colorants, dyes and other inactive ingredients are incorporated in the composition. In a more preferred embodiment, the solder stop compositions of the present invention contain about 25% to about 35% by weight glycerin binder; about 2% to about 5% by weight amorphous silica viscosity control agent; about 12% to about 17% by weight glass spheres thermal insulator filler, the glass spheres being filled with inert gas; about 6% to about 10% by weight ethylene glycol moisturizer extender control agent; and the remainder water.

The binders, otherwise designated herein as the carrier or the base material of the composition, are not critical as long as they are water soluble and remain water soluble after they have been mixed with the other ingredients of the composition and cured or dried on a substrate. The water-soluble binders must be capable of adhering to the substrate to which they are applied, for example, solder, and must be non-transferable and non-tacky when dried. The water-soluble binder must also act as a carrier for the thermal insulator filler which is a critical ingredient in the solder stop composition of the present invention.

Generally, the water-soluble binder forms the substantial portion of the solder stop composition. In certain embodiments of the present invention, the binder, which is dissolved in water during the mixing and application of the composition, is about 25% to about 35% by weight of the total solder stop composition. The water in the composition prior to curing or drying is typically about 35% to about 45% by weight of the total weight of the composition. In other embodiments, when the water-soluble binder and viscosity control agent are combined, the water-soluble binder and viscosity control agent, including dissolved water, comprise about 70% to about 84% by weight of the total composition. For example, when the water-soluble binder is glycerin and the viscosity control agent, discussed in greater detail below, is amorphous silica, the combined water-soluble binder and viscosity control agent in water are about 70% to about 84% by weight of the total composition. Examples of other water-soluble binders include polyvinyl alcohol, starch, methyl cellulose, polyethylene glycol and other water-soluble polyalkylene glycols, such as those described in U.S. Pat. No. 4,113,524 which is incorporated herein by reference in its entirety. The polyalkylene glycols suggested therein are useful as binders as long as they are water soluble and as long as they can be dried to a non-tacky, non-brittle, non-flaking, non-cracking coating on a substrate when used in conjunction with the other three basic ingredients of the present invention.

The amount of water used in the binder is not critical and varies according to the solubility of the particular binder material. Generally, only an amount of water sufficient to dissolve the binder material is used in the composition, and the viscosity control agent and other agents and fillers discussed in greater detail below are added to the water-soluble binder to achieve the desired viscosity of the solder stop composition. One skilled in the art can easily determine without undue experimentation the amount of water required to dissolve the particular binder and to provide a base material or carrier suitable for application to a substrate when it contains viscosity control agent, thermal insulator filler and moisturizer extender control agent of the composition. Specific amounts of water have been discussed above and are not meant to be limiting in scope. After curing or drying, most of the water has been removed and only residual quantities of water remain in the dried composition adhering to a substrate.

In accordance with the present invention, it is useful to utilize a thickener or viscosity control agent to adjust the consistency of the solder stop composition. The amount of viscosity control agent is generally not critical as long as there is a sufficient amount to increase the viscosity or the consistency of the composition to a semisolid state or paste-like consistency. The viscosity of the solder stop composition is generally such that the composition can be applied to a substrate by any one of several techniques including screening techniques, such as silk screening, or stencilling and the like. Thus, when a screening technique is used to apply the solder stop composition to a particular substrate, the consistency or viscosity of the solder stop composition must be such that the composition can be applied by this technique. Generally, a paste-like consistency or semisolid state is required so that the composition has a slight flow factor which enables the composition to be silk screened as well known in the art. As used herein, the term silk screening is that conventionally used in the art, and screen composition whether metal or non-metal, is insignificant.

The amount of viscosity control agent depends upon the particular water-soluble binder and the amount of water used therein to dissolve the binder, as well as the consistency of the thermal insulator filler and the water-soluble moisture extender control agent discussed in more detail below. One skilled in the art can easily adjust the amount of viscosity control agent to provide an amount sufficient to increase the consistency of the composition to a semisolid state or paste-like material, depending upon the particular technique required for application of the solder stop composition to the substrate. In certain embodiments of the present invention, about 1% to about 6% by weight of the total weight of the composition is viscosity control agent. In other preferred embodiments, for example, when the viscosity control agent is amorphous silica, the viscosity control agent is about 2% to about 5% by weight of the total composition.

Typical examples of viscosity control agents which may be used in the solder stop composition of the present invention include micronized mica, amorphous silica, colloidal silica and micronized glass. It is clearly within the purview of those skilled in the art to select an amount of viscosity control agent sufficient to control the consistency of the composition.

In other preferred characteristics, the viscosity control agent of the present invention is inert, that is, it does not react with or alter the desirable characteristics of the other basic ingredients of the solder stop composition. Additionally, the preferred viscosity control agents of the present invention are particles, the total surface area of which is larger when it wets out, that is when it becomes wetted by the water in the composition and does not dissolve therein. The viscosity control agent can be added at any stage or stages in mixing the composition and can be added as the final step in preparing the composition to insure that the appropriate consistency of the composition has been achieved and/or to insure that the thermal insulator is also wetted.

One of the critical ingredients of the solder stop composition of the present invention is the thermal insulator filler which must be present in the composition in an amount sufficient to prevent heat from passing through the composition when the composition is in a dried, solid state on a substrate. The thermal insulator filler in the solder stop composition when used in conjunction with the other ingredients of the composition, must provide an adequate mask over the substrate to which it is applied, to prevent heat from passing therethrough and adversely effecting the substrate, or portions thereof, to which it is applied. Thus, when there is a meltable substance on a substrate, the thermal insulator filler used in conjunction with the other ingredients of the solder stop composition, prevents the passage of heat through the solder stop composition cured or dried on the substrate, thereby protecting the meltable substance on the substrate from exposure to heat which would cause the substance to melt, decompose or otherwise deteriorate in integrity. By incorporating the thermal insulator filler in the solder stop composition of the present invention, solder which is plated or coated on a substrate, is protected and does not melt when the protected area contacts molten solder at about 260° C. (500° F.) in a solder pot.

The thermal insulator filler is generally inert and is not water-soluble, and it is not soluble in the solder stop composition. The thermal insulator filler is preferably uniformly mixed throughout the solder stop composition. The thermal insulator filler is finely divided and is generally of very fine mesh. For example, in preferred embodiments, the thermal insulator filler ranges from about 10 microns to about 30 microns. Although finer particle sizes and larger particle sizes may be used in the solder stop compositions of the present invention, larger particle sizes are generally not necessary to achieve the thermal barrier effect of the solder stop composition of the present invention. Although particle sizes smaller than 10 microns may be used in the solder stop compositions of the present invention, optimum results are generally achieved when particle sizes are about 10 microns or larger. Naturally, one skilled in the art would realize that the size of the thermal insulator filler particles can be no greater than the thickness of the layer of solder stop composition applied to a given substrate.

The amount of thermal insulator filler used in the solder stop composition of the present invention is not critical as long as there is a sufficient amount of the thermal insulator filler to prevent or inhibit heat from passing or radiating through the composition in a dried, solid state on a substrate. Generally, about 10% to about 20% by weight of the total composition is thermal insulator filler, and in more preferred embodiments where the thermal insulator filler is hollow glass spheres or glass spheres filled with an inert gas, such as nitrogen, and having a size ranging from about 10 to about 30 microns, the solder stop composition contains from about 12% to about 17% by weight of the glass spheres, otherwise known as glass microballoons.

Examples of thermal insulator fillers which may be used in the solder stop composition of the present invention, include glass spheres filled with gas, hollow phenolic spheres, hollow ceramic spheres, hollow glass spheres and micronized mica. The spheres which are filled with gas, are well known in the art and are commercially available. The gas which is generally utilized in such spheres may be any of the inert gases or air. Preferred inert gases used in the spheres include nitrogen and argon.

A moisturizing agent, otherwise described herein as a moisturizer extender control agent, is generally required in the solder stop composition of the present invention to prevent brittleness, cracking and tackiness of the solder stop composition when it is in a dried, solid state on a substrate. The moisturizing agent in the solder stop composition also inhibits flaking of the solder stop composition when it is dried and adhered to the substrate. The moisturizer extender control agents used in the solder stop composition of the present invention must also be water soluble.

The amount of water-soluble moisturizer extender control agent used in the solder stop composition of the present invention is not critical as long as there is an amount sufficient to prevent cracking, flaking, brittleness and tackiness of the solder stop composition when it is in the dried, solid state on a substrate. The amount can be easily determined by one skilled in the art without undue experimentation. If the concentration of moisturizing agent is too low, then there will be noticeable cracking, brittleness and/or flaking of the composition when it is dried on a substrate. If the concentration of the moisturizing agent is too high, then it will interfere with the consistency of and application of the composition and may cause tackiness in the cured or dried composition. Generally, it has been determined that if the amount of thermal insulator filler in the composition is reduced, then the amount of moisturizing agent must also be reduced.

In most cases, the water-soluble moisturizer extender control agent is about 4.0% to about 12.0% by weight of the total solder stop composition. In certain preferred embodiments, for example, when the moisturizer extender control agent is ethylene glycol, the moisturizer extender control agent is about 6% to about 10% by weight of the total composition. Typical examples of the moisturizing agent include various high boiling inert organic liquids, such as the alkylene glycols which are water soluble.

The solder stop composition of the present invention may be applied to any substrate by conventional applicator techniques including brushing, extruding, silk screening, stencilling and any other technique well known in the art. However, the solder stop composition of the present invention is best applied to a particular substrate in selective areas on the substrate by silk screening techniques and by stencilling techniques well known in the art. It is for this reason that the composition contains a viscosity control agent which is easily adjustable to provide the approriate consistency to the solder stop composition so that the solder stop composition can be applied by any of the several conventional methods discussed above.

The solder stop composition of the present invention can be applied as a single layer or it can be applied as a plurality of layers, and the curing or drying step of the method can be carried out after each application of the solder stop composition or at the end of the application of several layers. Furthermore, the layer or layers can be applied in any desired thickness so that there will be sufficient solder stop composition on the substrate to prevent heat transfer through the dried solder stop composition to the substrate. Generally, for prevention of remelting of solder, the layer or layers of solder stop composition are applied to the substrate at a thickness of about 15 mils to about 20 mils. The thickness of the coating or coatings (layer or layers) is not critical as long as there is a sufficient thickness to prevent the transfer or conduction of heat through the solder stop composition coating dried on the substrate whereby the meltable substance on the substrate will not melt and/or flow when exposed to elevated temperatures, for example temperatures up to 260° C. (500° F.) or higher for about 4 to about 10 seconds.

The solder stop composition can be cured or dried on the substrate to a dried state at any temperature below the decomposition temperature of the solder stop composition and/or below the temperature at which the meltable substance on the substrate melts, flows and/or decomposes. The curing or drying process must be sufficient to remove water and any combination of air drying, vacuum drying and drying at elevated temperatures can be used. Generally, the preferred temperatures for curing or drying the composition on the substrate to a dried state are from ambient to about 85° C. The drying or curing must remove most of the water from the composition, leaving only small or residual quantities of water, for example, that amount of water which is a part of the moisturizer and which helps to prevent embrittlement of the dried or cured composition. Thus, in accordance with the present invention, there is provided a method of preventing a melt condition in a meltable substance, such as tin-lead alloy solder or solder plate, on a substrate, such as a copper conductor pattern adhered to a glass-reinforced epoxy board, comprising applying a composition containing water, a water-soluble binder, a viscosity control agent, a thermal insulator filler, and a water-soluble moisturizer extender control agent on a surface to be exposed to heat, the composition being removable in its entirety by water washing; and curing or drying the composition on the substrate to a dried state. In further embodiments, the entire unit, that is, the substrate, the meltable substance thereon and the coating of solder stop composition, or at least a portion thereof, are heated, whereby the meltable substance retains its solid integrity during the application of heat because of the solder stop composition coated thereon; and thereafter, the dried composition is removed from the surface of the substrate by water washing. A melt condition exists when a sufficient amount of heat is applied to or conducts to the meltable substance to cause all or part of the meltable substrate to lose its integrity. In preferred embodiments, the solder stop composition is applied over a solder surface on a substrate whereby the solder surface is protected from heat, for example, the heat of molten solder in which the substrate is dipped, and thereby prevents reflowing of the solder when the substrate is placed in the molten solder at a temperature of about 260° C. (500° F.) for about 4 to about 10 seconds.

The consistency or controlled viscosity of the solder stop composition of the present invention permits the selective application of the composition on a desired surface by any suitable technique in any desired pattern, that is, the consistency or viscosity of the composition can be easily controlled so that it can be applied in any areas as desired on a particular substrate, for example, by silk screening, stencilling and the like, as discussed above. These techniques are conventional and are well known in the art.

The following specific example describes the novel solder stop composition and the method of applying the composition to a substrate to protect a meltable substance thereon in accordance with the present invention. The example is intended for illustrative purposes only and should not be construed as a limitation.

A solder stop composition was prepared in accordance with the present invention by mixing 100 parts (about 77%) by weight of glycerin dissolved in water and containing amorphous silica as a viscosity control agent at a concentration of about 3–4 percent by weight of the glycerin. The combined glycerin and amorphous silica is a commercial composition identified as Lonco Solder Stop W561 by London Chemical Company, Bensenville, Ill. About 20 parts (about 15%) by weight ethylene glycol and about 10 parts (about 8%) by weight of glass microballoons were thoroughly mixed into the glycerin/amorphous silica composition by stirring. The glass microballoons had a size of about 10 to about 30 microns and are commercially available as Eccospheres SI Glass Microballoons. High speed or high shear mixing by machine is generally undesirable because it breaks the microballoons into pieces which then become poor insulators. These microballoons were filled with nitrogen gas.

The foregoing homogeneous mixture of ingredients was applied by factory screening techniques to a printed wiring board having solder plated thereon. The layer of solder stop composition was cured (dried) at about 140° F. (60° C.) for about 1 hour.

The printed wiring boards containing the dried solder stop composition of the present invention were non-tacky to touch, and no cracking or flaking of the composition coated on the substrate was observed. The coated substrate can be easily handled and shipped and used in conventional in-line machine operations without concern for the integrity of the coated composition. The circuit boards containing the composition coated thereon can be stacked and shipped without adhering to each other. It was also determined that meltable solder alloy plated on the printed wiring boards remained intact when the printed wiring board having the coated solder stop composition of the present invention thereon was brought in contact with hot molten solder at 500° F. (260° C.) for about 4 to about 10 seconds in the solder pot. No melting or flowing of the meltable solder was observed with the layer of solder stop composition described above coated thereon at a thickness of about 15 to 20 mils.

After the printed wiring board containing the solder stop composition was contacted with hot molten solder in a solder pot, the wiring board was cooled and water was sprayed on the surface. The solder stop composition was completely removed by the water, and there was no residue or contamination of the solder stop composition of the present invention remaining on the printed wiring board. The solder showed no evidence of remelting and reflowing.

In accordance with the present invention, a solder stop composition which dries readily without shrinking, cracking or flaking from a substrate, prevents a meltable substance, such as solder, from remelting when the meltable substance is subjected to high temperatures, for example, molten solder in a solder pot. Furthermore, the solder stop compositions of the present invention can be easily removed by water washing without leaving contamination or residual matter on the substrate. The solder stop compositions of the present invention are non-tacky after curing or drying and can be easily applied to the substrate by conventional techniques, such as silk screening.

While the present invention has been described in detail with particular reference to certain preferred embodiments thereof, it will be understood that variations and modifications can be effected within the spirit and scope of the invention.

What is claimed is:

1. A solder stop composition capable of being cured to a dried state on a substrate and removable from the substrate by water, comprising:
   (a) a water soluble binder dissolved in water;
   (b) a viscosity control agent in an amount sufficient to increase the consistency of the composition to a semisolid paste;
   (c) a thermal insulator filler in an amount which prevents heat from passing through the composition in a dried, solid state on a substrate; and
   (d) a water soluble moisturizer extender control agent in an amount sufficient to prevent cracking and tackiness of the solder stop composition in the dried, solid state on a substrate.

2. The solder stop of claim 1 wherein the water soluble binder, viscosity control agent and water comprise about 70% to about 84% by weight of the composition.

3. The solder stop of claim 1 wherein the thermal insulator filler comprises about 10% to about 20% by weight of the composition.

4. The solder stop of claim 1 wherein the water-soluble moisturizer extender control agent comprises about 4.0% to about 12% by weight of the composition.

5. The solder stop of claim 1 wherein the thermal insulator filler is selected from the group consisting of glass beads filled with inert gas and hollow glass beads.

6. The solder stop composition of claim 1 cured to a dried state on a substrate and removable from the substrate by water, comprising:
   (a) the water soluble binder;
   (b) the viscosity control agent in an amount sufficient to increase the consistency of the composition to a semisolid paste;
   (c) the thermal insulator filler in an amount which prevents heat from passing through the composition in a dried, solid state on a substrate; and
   (d) the water soluble moisturizer extender control agent in an amount sufficient to prevent cracking and tackiness of the solder stop composition in the dried, solid state on a substrate.

7. A solder stop composition comprising about 25% to about 35% by weight of a water soluble binder; about 1% to about 6% by weight of a viscosity control agent; about 10% to about 20% of a thermal insulator filler; about 4% to about 12% of a water soluble moisturizer extender control agent; and the balance water.

8. The solder stop composition of claim 7, wherein the water comprises about 45% to about 55% by weight of the composition.

9. The solder stop composition of claim 7 wherein the binder is selected from the group consisting of glycerin, polyvinyl alcohol, starch and methyl cellulose.

10. The solder stop composition of claim 7 wherein the viscosity control agent is selected from the group consisting of micronized mica, amorphous silica and micronized glass.

11. The solder stop composition of claim 7 wherein the thermal insulator filler is selected from the group consisting of glass spheres filled with gas, hollow phenolic spheres, ceramic spheres, hollow glass spheres and micronized mica.

12. The solder stop composition of claim 11 wherein the gas is selected from the group consisting of air, nitrogen and argon.

13. The solder stop composition of claim 7 wherein the moisturizer extender control agent is a water-soluble alkylene glycol.

14. The solder stop composition of claim 7 comprising about 25% to about 35% by weight glycerin binder; about 2% to about 5% by weight amorphous silica viscosity control agent; about 12% to about 17% by weight glass spheres thermal insulator filler, the spheres being filled with inert gas; about 6% to about 10% by weight ethylene glycol moisturizer extender control agent; and the remainder water.

15. The dried composition of claim 14.

16. The dried composition of claim 7.